(12) United States Patent
Choi et al.

(10) Patent No.: US 12,740,393 B2
(45) Date of Patent: Sep. 15, 2026

(54) INTEGRATED CIRCUIT DEVICES INCLUDING A VIA AND METHODS OF FORMING THE SAME

(71) Applicant: Samsung Electronics Co., Ltd., Suwon-si (KR)

(72) Inventors: Jaemyung Choi, Niskayuna, NY (US); Kang-Ill Seo, Albany, NY (US); Janggeun Lee, Delmar, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 740 days.

(21) Appl. No.: 17/822,246

(22) Filed: Aug. 25, 2022

(65) Prior Publication Data

US 2023/0352399 A1 Nov. 2, 2023

Related U.S. Application Data

(60) Provisional application No. 63/335,868, filed on Apr. 28, 2022, provisional application No. 63/335,348, filed on Apr. 27, 2022.

(51) Int. Cl.
*H10W 20/42* (2026.01)
*H10W 20/00* (2026.01)

(52) U.S. Cl.
CPC ........... *H10W 20/42* (2026.01); *H10W 20/01* (2026.01)

(58) Field of Classification Search
CPC ........... H01L 21/76885; H01L 23/5283; H01L 23/53266; H01L 23/53252; H01L 21/76877; H01L 23/53257; H01L 23/53295; H01L 23/5226; H01L 21/768; H01L 21/7682; H01L 21/76834; H01L 21/76843; H01L 21/7684; H10W 20/42; H10W 20/01; H10W 20/72; H10W 20/077; H10W 20/435; H10W 20/46; H10W 20/056; H10W 20/4441; H10W 20/47

See application file for complete search history.

(56) References Cited

U.S. PATENT DOCUMENTS

| | | |
|---|---|---|
| 5,834,369 A | 11/1998 | Murakami et al. |
| 6,787,911 B1 | 9/2004 | Zhao et al. |
| 7,572,721 B2 | 8/2009 | Kim |

(Continued)

FOREIGN PATENT DOCUMENTS

| | | |
|---|---|---|
| KR | 20180019527 A | 2/2018 |
| KR | 20220007984 A | 1/2022 |

OTHER PUBLICATIONS

Extended European Search Report corresponding to EP 23154418.0; dated Oct. 5, 2023 (9 pages).

(Continued)

*Primary Examiner* — Galina G Yushina
(74) *Attorney, Agent, or Firm* — Myers Bigel, P.A.

(57) ABSTRACT

Integrated circuit devices and methods of forming the same are provided. The integrated circuit devices may include a lower metal via, an upper metal via, a lower metal wire comprising a lower surface contacting the lower metal via and an upper surface contacting the upper metal via, and an upper metal wire on the upper metal via. The upper metal via is between the lower metal wire and the upper metal wire, and each of the lower metal via, the lower metal wire and the upper metal via comprises ruthenium (Ru) or molybdenum (Mo).

15 Claims, 18 Drawing Sheets

(56) References Cited

U.S. PATENT DOCUMENTS

| | | | | |
|---|---|---|---|---|
| 8,252,680 | B2 | 8/2012 | Lavoie | |
| 9,536,832 | B1 | 1/2017 | Leobandung | |
| 9,754,822 | B1 | 9/2017 | Chou et al. | |
| 11,145,544 | B2 | 10/2021 | Kelly | |
| 11,177,212 | B2 | 11/2021 | Huang et al. | |
| 11,189,568 | B2 | 11/2021 | Anderson et al. | |
| 11,244,853 | B2 | 2/2022 | Motoyama et al. | |
| 2007/0138638 | A1* | 6/2007 | Ota | H01L 24/05 257/E23.142 |
| 2010/0084770 | A1 | 4/2010 | Sakuma et al. | |
| 2014/0085597 | A1* | 3/2014 | Katou | B29C 33/3857 349/194 |
| 2014/0167229 | A1* | 6/2014 | Teng | H01L 23/53238 257/649 |
| 2014/0239501 | A1* | 8/2014 | Tsai | H01L 23/53233 438/653 |
| 2015/0311152 | A1 | 10/2015 | Ting et al. | |
| 2018/0294212 | A1* | 10/2018 | Chen | H01L 21/481 |
| 2019/0355621 | A1 | 11/2019 | Marcadal et al. | |
| 2020/0126841 | A1* | 4/2020 | Dai | H01L 23/481 |
| 2020/0357692 | A1* | 11/2020 | Mignot | H01L 21/76885 |
| 2021/0035906 | A1 | 2/2021 | Chen et al. | |
| 2021/0050260 | A1 | 2/2021 | Park et al. | |
| 2021/0098376 | A1 | 4/2021 | Lin et al. | |
| 2021/0134660 | A1 | 5/2021 | Wang et al. | |
| 2021/0335655 | A1 | 10/2021 | Hsueh et al. | |
| 2022/0013467 | A1* | 1/2022 | Lee | H10B 12/05 |
| 2022/0020688 | A1 | 1/2022 | Xie et al. | |
| 2022/0068896 | A1* | 3/2022 | Kwon | H01L 23/49811 |
| 2022/0375852 | A1* | 11/2022 | Chang | H01L 21/76897 |
| 2022/0392838 | A1 | 12/2022 | Motoyama et al. | |
| 2023/0022545 | A1 | 1/2023 | Lee et al. | |
| 2023/0026707 | A1* | 1/2023 | King | H10F 77/206 |

OTHER PUBLICATIONS

"Request for the Submission of an Opinion" with English language translation, KR Application No. 10-2022-0169105, May 18, 2026, 16 pp.

* cited by examiner

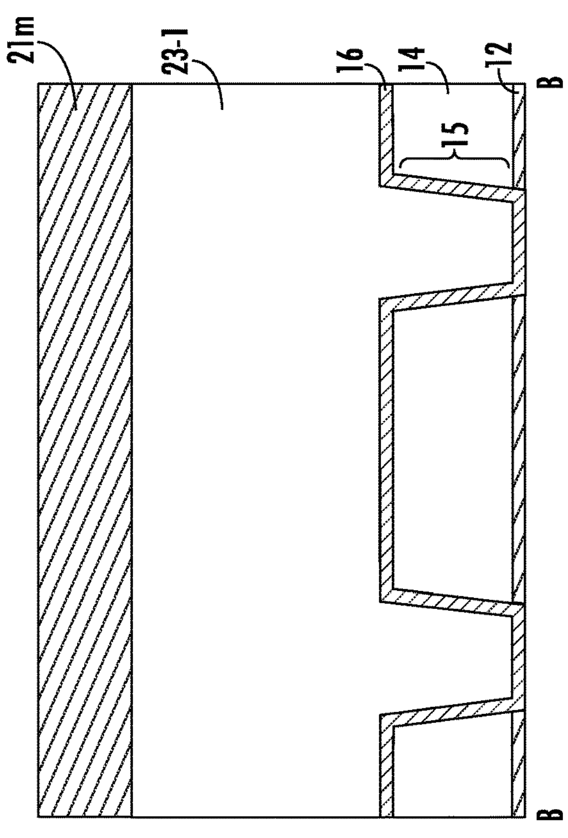
FIG. 12
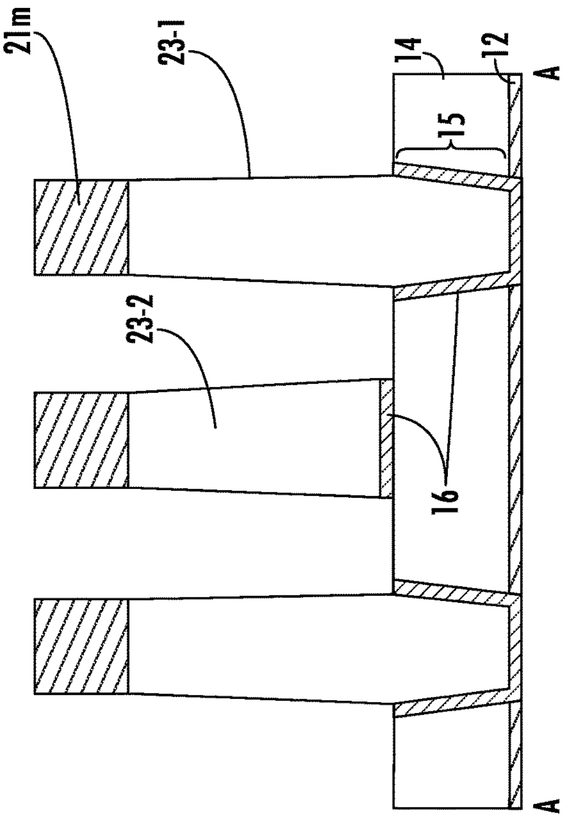

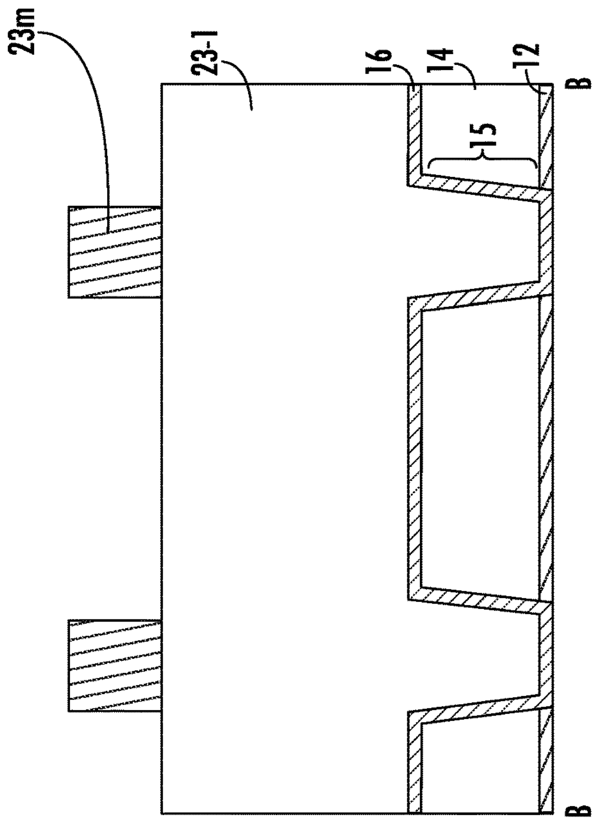
23m
23-1
16
14
12
15
B
B
FIG. 13
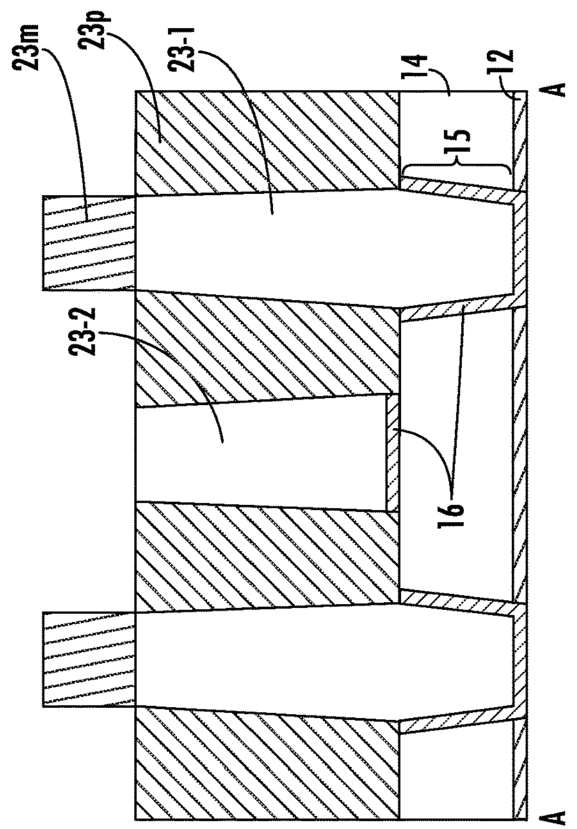
23m
23p
23-1
14
12
15
A
23-2
16
A

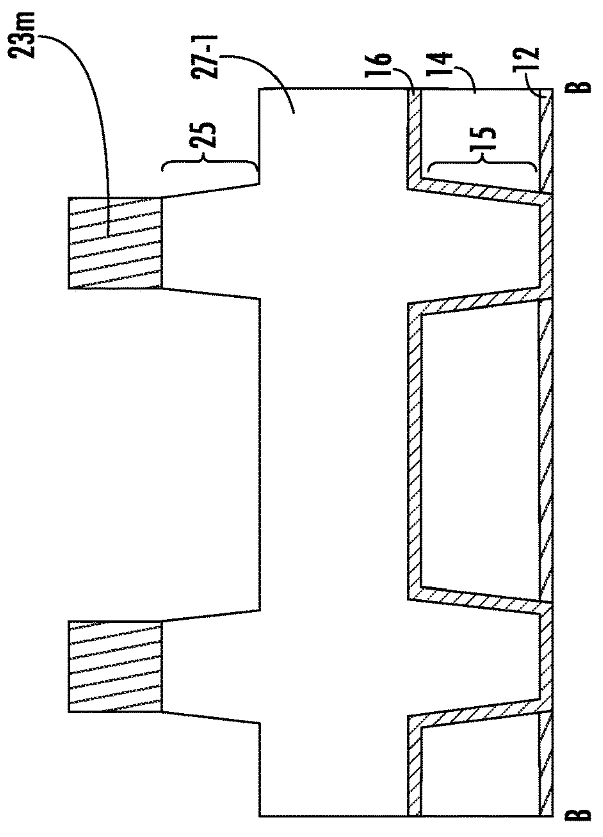
23m
27-1
25
16
14
12
15
B
B
FIG. 14
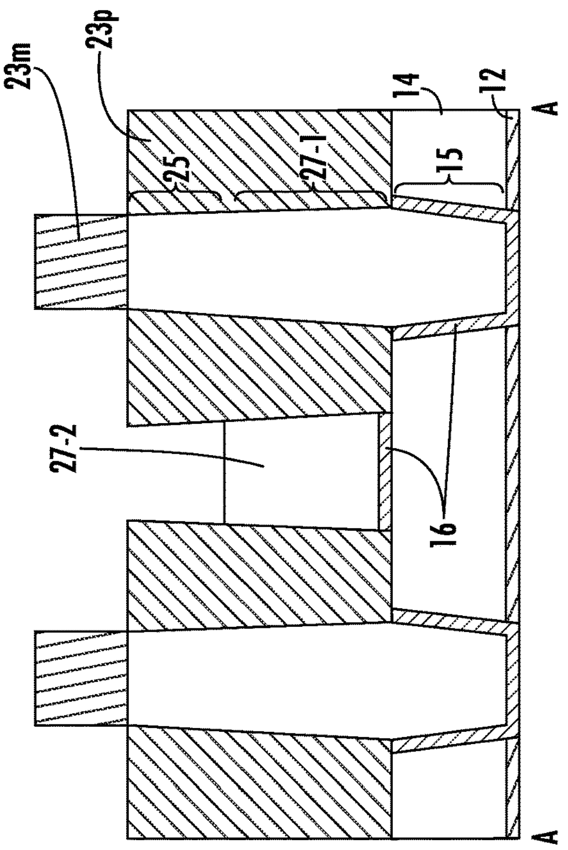
23m
23p
25
27-1
14
12
15
27-2
16
A
A

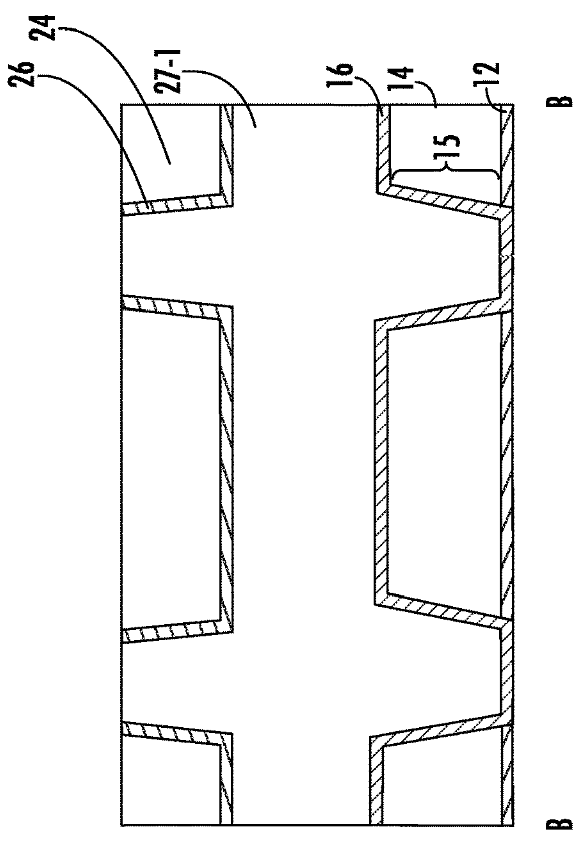
24
26
27-1
16
14
12
15
B
B
FIG. 15
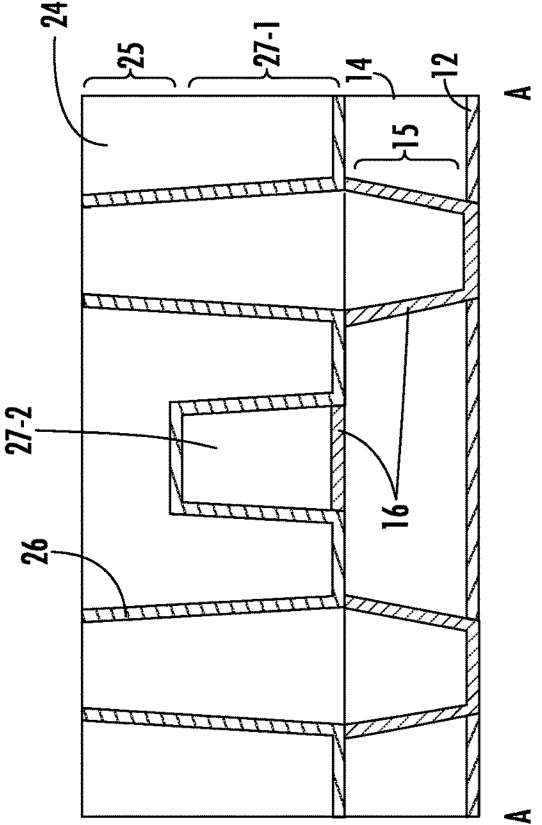
24
25
27-1
14
12
15
27-2
16
26
A
A

INTEGRATED CIRCUIT DEVICES INCLUDING A VIA AND METHODS OF FORMING THE SAME

CROSS-REFERENCE TO RELATED APPLICATIONS

This application claims priority to U.S. Provisional Application Ser. No. 63/335,868 entitled VIA SCHEMES AND METHODS OF FORMING THE SAME, filed in the USPTO on Apr. 28, 2022, and to U.S. Provisional Application Ser. No. 63/335,348 entitled SELF-ALIGNED RECESSED CONTACT FOR SUBTRACTIVE RUTHENIUM, filed in the USPTO on Apr. 27, 2022, the disclosures of which are hereby incorporated by reference herein in their entireties.

BACKGROUND

The present disclosure generally relates to the field of electronics and, more particularly, to integrated circuit devices.

Various back end of line (BEOL) structures with different configurations and materials have been suggested to reduce resistance thereof and to increase a distance between conductive elements.

SUMMARY

According to some embodiments, integrated circuit devices may include a lower metal via, an upper metal via, a lower metal wire comprising a lower surface contacting the lower metal via and an upper surface contacting the upper metal via, and an upper metal wire on the upper metal via. The upper metal via is between the lower metal wire and the upper metal wire, and each of the lower metal via, the lower metal wire and the upper metal via comprises ruthenium (Ru) or molybdenum (Mo).

According to some embodiments, integrated circuit devices may include a metal wire and a metal via comprising an upper surface. A middle portion of the upper surface contacts the metal wire, and an edge portion of the upper surface is recessed toward a lower surface of the metal via, creating a recess therein.

According to some embodiments, methods of forming an integrated circuit devices may include forming a lower structure comprising a lower insulating layer and a lower metal via in the lower insulating layer, forming a metal layer on the lower structure, the metal layer contacting the lower metal via, etching the metal layer, thereby forming a preliminary metal wire, etching an upper portion of the preliminary metal wire, thereby forming a lower metal wire contacting the lower metal via and an upper metal via protruding from the lower metal wire, and forming an upper metal wire on the upper metal via. Each of the lower metal via and the metal layer comprises ruthenium (Ru) or molybdenum (Mo).

BRIEF DESCRIPTION OF THE DRAWINGS

FIGS. 9 to 15 are cross-sectional views illustrating methods of forming an integrated circuit device according to some embodiments.

DETAILED DESCRIPTION

Ruthenium (Ru) or molybdenum (Mo) may be used to form elements (e.g., a via or a wire) in a BEOL process to reduce resistance thereof, and an adhesion layer may be added between the elements including Ru and Mo and other layers for better adhesion therebetween. The adhesion layer generally has a resistance higher than elements including Ru and Mo and may increase a resistance of a conductive structure in a BEOL structure.

According to some embodiments, lower and upper vias and a metal wire connecting those vias may include the same metal element (e.g., Ru or Mo) and may be connected to each other without an adhesion layer. A conductive structure, including the pair of vias and the metal wire, therefore may have relatively low resistance.

According to some embodiments, an edge portion of an upper surface of a lower via may be removed to increase a distance between the lower via and an adjacent a metal wire. That increased distance between the lower via and the metal wire may reduce the likelihood of an electrical short therebetween and may improve time dependent dielectric breakdown (TDDB) margin.

Figure 1:
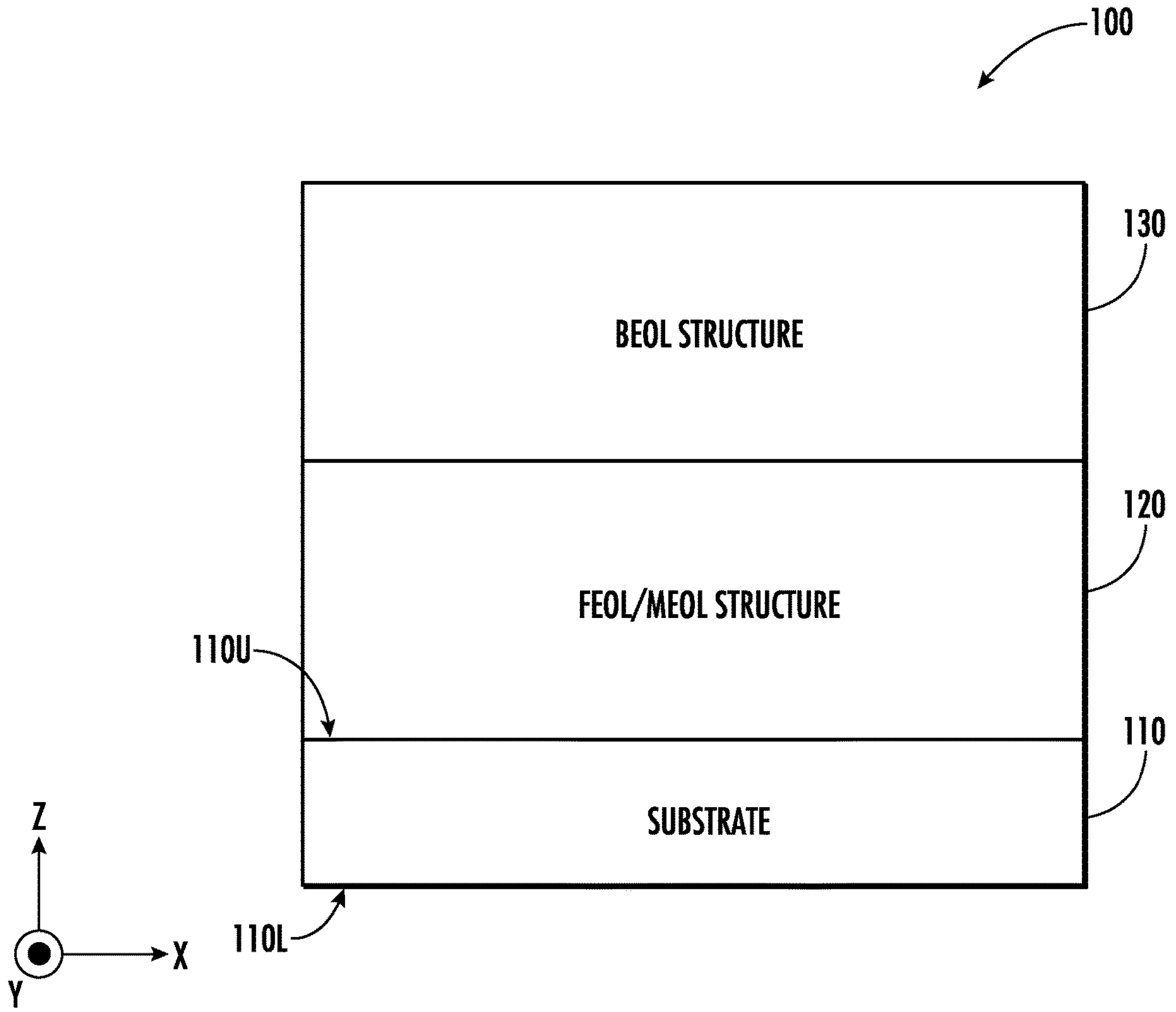
FIG. 1 is a diagram illustrating an integrated circuit device according to some embodiments.

FIG. 1 is a diagram illustrating an integrated circuit device 100 according to some embodiments. The integrated circuit device 100 may include a substrate 110, a front-end-of-line (FEOL)/middle-end-of-line (MEOL) structure 120 that includes elements formed during FEOL and MEOL processes, and a BEOL structure 130 that includes elements formed during a BEOL process. For example, the FEOL/MEOL structure 120 includes transistors, and/or capacitors, and the BEOL structure 130 includes metal wires and/or metal vias.

The substrate 110 may include one or more semiconductor materials, for example, Si, Ge, SiGe, GaP, GaAs, SiC, SiGeC and/or InP. In some embodiments, the substrate 110 may be a bulk substrate (e.g., a bulk silicon substrate) or a semiconductor on insulator (SOI) substrate. For example, the substrate 110 may be a silicon wafer.

The substrate 110 may include an upper surface 110U facing the FEOL/MEOL structure 120 and a lower surface 110L opposite the upper surface 110U. The upper surface 110U and the lower surface 110L of the substrate 110 may parallel to a first horizontal direction X and a second horizontal direction Y. In some embodiments, the first horizontal direction X and the second horizontal direction Y may be perpendicular to each other.

Figure 2:
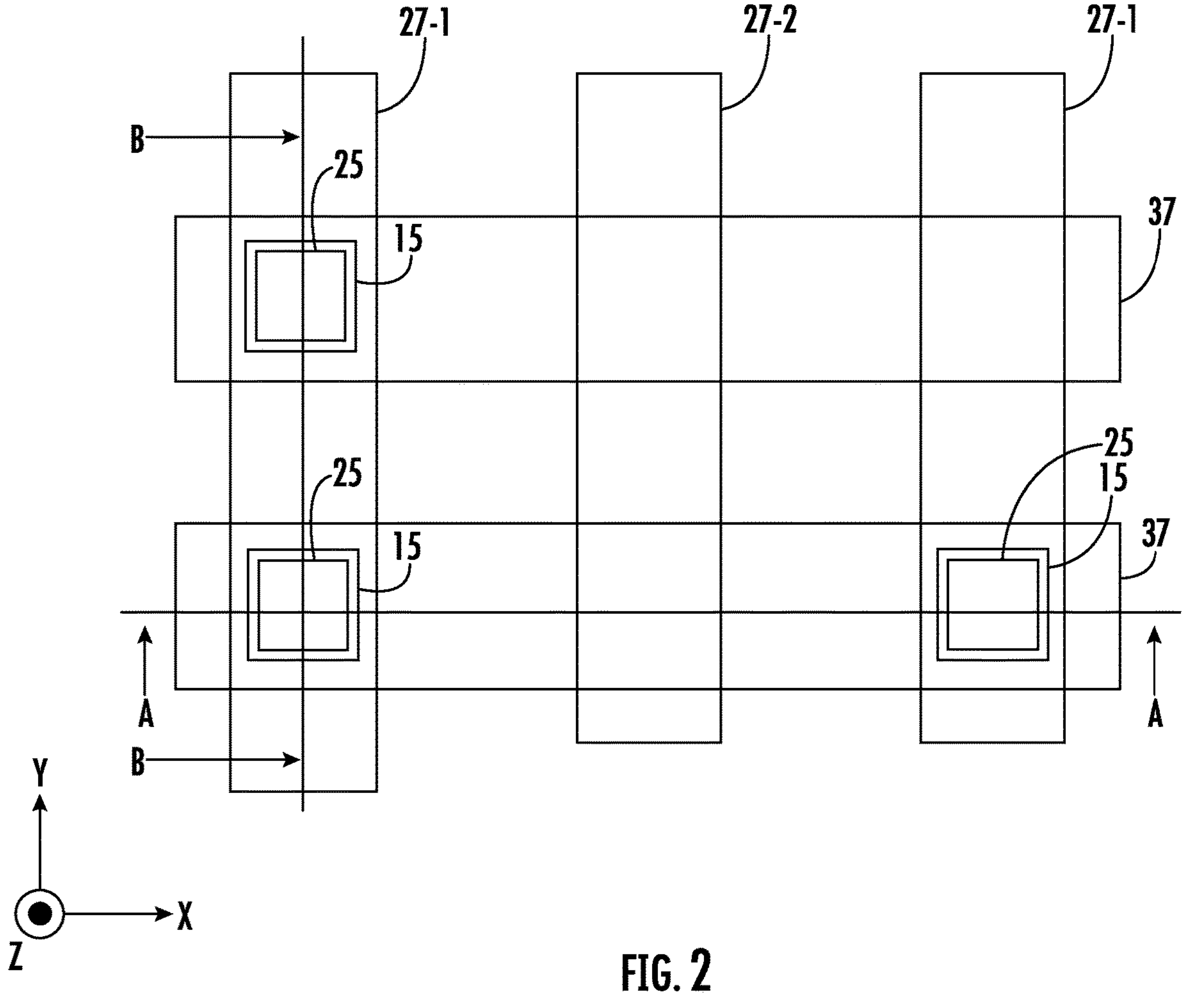
FIG. 2 is a layout of a BEOL structure according to some embodiments.
Figure 3A:
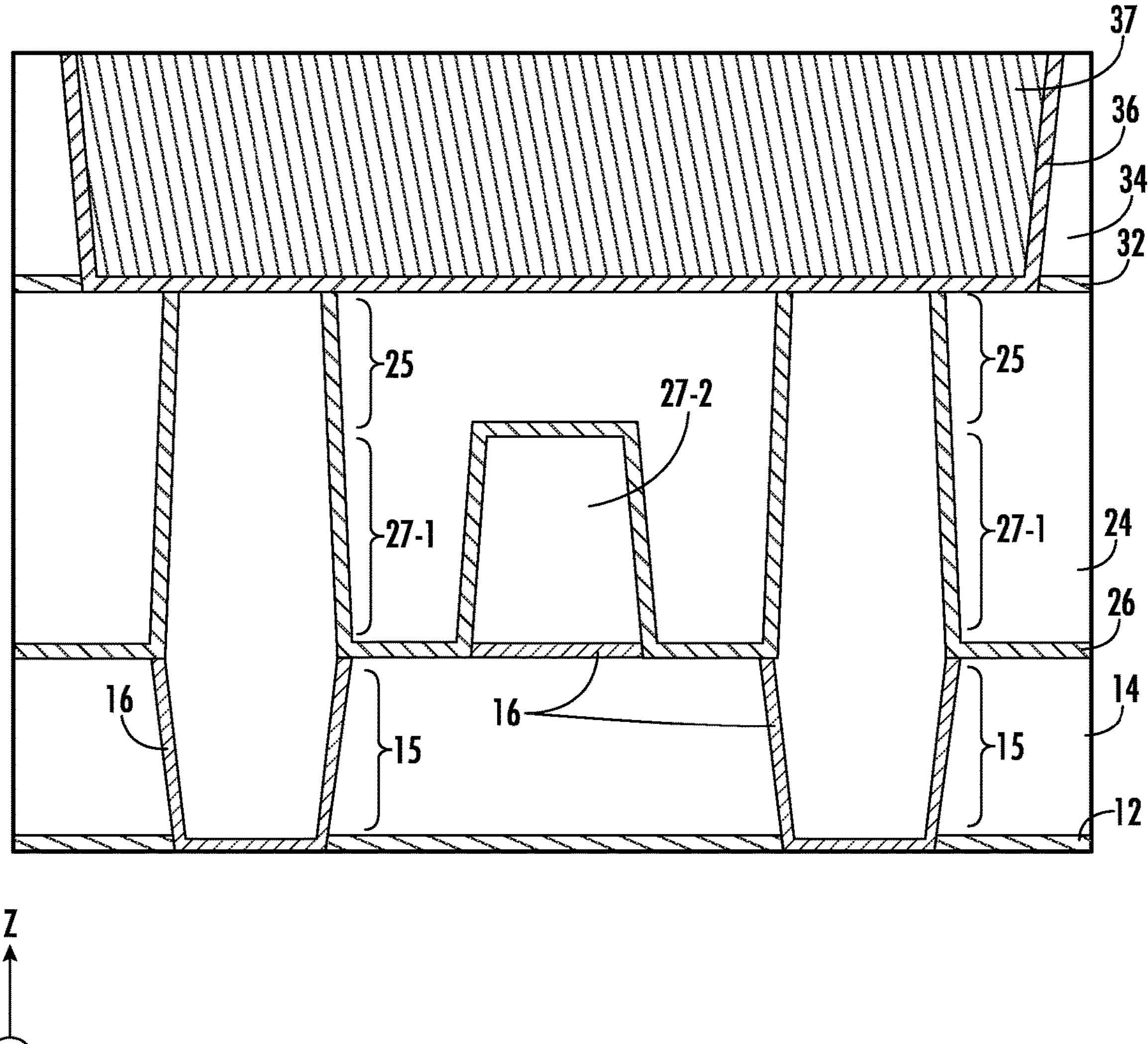
FIGS. 3A and 3B are cross-sectional views taken along a line A-A and a line B-B in FIG. 2, respectively.
Figure 3B:
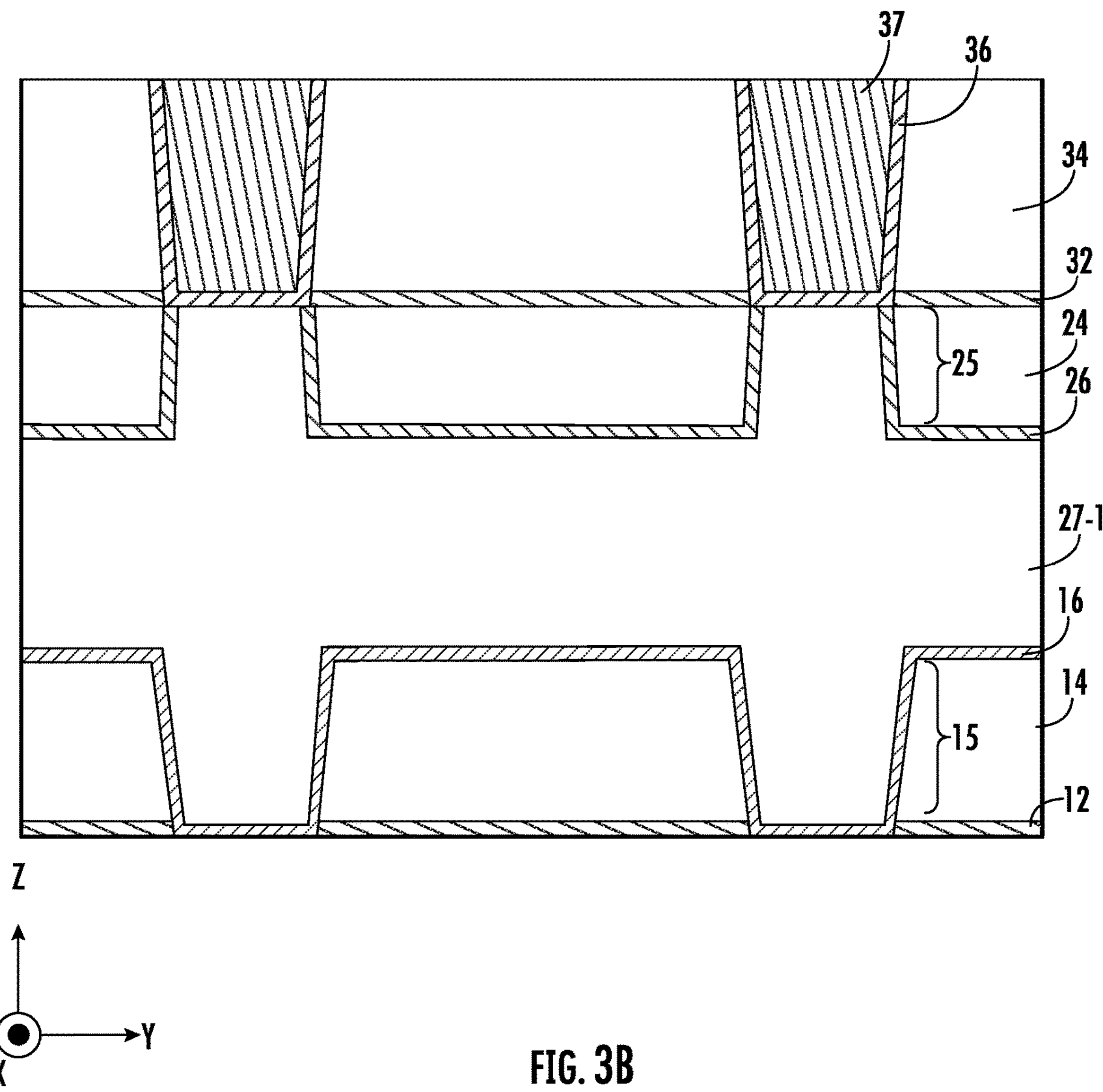

FIG. 2 is a layout of a BEOL structure according to some embodiments, and FIGS. 3A and 3B are cross-sectional views taken along a line A-A and a line B-B in FIG. 2, respectively.

Referring to FIGS. 2, 3A and 3B, the BEOL structure may include a lower metal via 15, first and second lower metal wires 27-1 and 27-2 and an upper metal via 25. The first lower metal wire 27-1 may include a lower surface contacting the lower metal via 15 and an upper surface contacting the upper metal via 25. As used herein, a lower surface of an element may refer to a surface facing a substrate (e.g., the substrate 110 in FIG. 1), and an upper surface of the element may be opposite the lower surface thereof. The upper surface and the lower surface of the element may be spaced apart from each other in a vertical direction Z. The vertical direction Z may be perpendicular to the first and second horizontal directions X and Y.

In some embodiments, each of the lower metal via 15, the first and second lower metal wires 27-1 and 27-2 and the upper metal via 25 may include the same metal element that can be patterned using a subtractive patterning process. For example, each of the lower metal via 15, the first and second lower metal wires 27-1 and 27-2 and the upper metal via 25 may include Ru or Mo. In some embodiments, each of the lower metal via 15, the first and second lower metal wires 27-1 and 27-2 and the upper metal via 25 may consist of the same metal element (e.g., Ru or Mo) and may be substantially devoid of other element(s). As used herein, "substantially devoid of other element(s)" means that the amount of those other element(s) is less than 5%, less than 3%, less than 1%, less than 0.5%, less than 0.1%, less than 0.05% or 0%, by weight of the each of the lower metal via 15, the first and second lower metal wires 27-1 and 27-2 and the upper metal via 25. For example, the each of the lower metal via 15, the first and second lower metal wires 27-1 and 27-2 and the upper metal via 25 may consist of Ru.

In some embodiments, the lower metal via 15 may be a first monolithic layer (e.g., a monolithic Ru layer or a monolithic Mo layer), and the first lower metal wire 27-1 and the upper metal via 25 may be collectively a second monolithic layer (e.g., a monolithic Ru layer or a monolithic Mo layer). For example, the first lower metal wire 27-1 and the upper metal via 25 may be a lower portion and an upper portion of the second monolithic layer, respectively. A width of the second monolithic layer, in the first horizontal direction X, may decrease with increasing distance from the lower metal via 15, as illustrated in FIG. 3A. The second lower metal wire 27-2 may not be connected to an upper via in the cross-sectional view illustrated in FIG. 3A.

The lower metal via 15 may contact the first lower metal wire 27-1, and no adhesion layer may be provided between the lower metal via 15 and the first lower metal wire 27-1. Accordingly, portions of the lower metal via 15 and the first lower metal wire 27-1 adjacent an interface therebetween may include only a metal element included in the lower metal via 15 and the first lower metal wire 27-1, and that interface may be devoid of nitrogen. In some embodiments, the interface between the lower metal via 15 and the first lower metal wire 27-1 may not be visible and/or detectable.

A first etch stop layer 12 and a first insulating layer 14 may be provided, and the lower metal via 15 may be provided in the first insulating layer 14. In some embodiments, an upper surface of the lower metal via 15 and an upper surface of the first insulating layer 14 may be coplanar with each other.

A first adhesion layer 16 may be provided on a lower surface and a side surface of the lower metal via 15. In some embodiments, the first adhesion layer 16 may contact the lower surface and the side surface of the lower metal via 15. Lower portions of the lower metal via 15 and the first adhesion layer 16 may be in the first etch stop layer 12. The first adhesion layer 16 may also be provided between the second lower metal wire 27-2 and the first insulating layer 14.

A second insulating layer 24 may be provided on the first insulating layer 14. The first and second lower metal wires 27-1 and 27-2 and the upper metal via 25 may be provided in the second insulating layer 24. A second adhesion layer 26 may separate the second insulating layer 24 from the first and second lower metal wires 27-1 and 27-2 and the upper metal via 25 and may separate the second insulating layer 24 from the first insulating layer 14. In some embodiments, the second adhesion layer 26 may continuously extend from a side surface of the first lower metal wire 27-1 onto a side surface of the upper metal via 25 and, in some embodiments, may contact the side surface of the first lower metal wire 27-1 and the side surface of the upper metal via 25.

A third insulating layer 34 may be provided on the second insulating layer 24, and an upper metal wire 37 may be provided in the third insulating layer 34. A diffusion barrier layer 36 may be provided on a lower surface and a side surface of the upper metal wire 37. In some embodiments, the diffusion barrier layer 36 may contact the lower surface and the side surface of the upper metal wire 37. The diffusion barrier layer 36 may contact the upper metal via 25. The upper metal wire 37 may be electrically connected to the upper metal via 25 through the diffusion barrier layer 36. A second etch stop layer 32 may be provided between the second insulating layer 24 and the third insulating layer 34. Although the diffusion barrier layer 36 is illustrated as a single layer, the diffusion barrier layer 36 may include multiple layers.

Each of the first and second etch stop layers 12 and 32 may include a layer including nitrogen (e.g., a SiN layer, a SiON layer, a SiCN layer and/or an AlN layer). Each of the first and second adhesion layers 16 and 26 and the diffusion barrier layer 36 may include a layer including nitrogen (e.g., a SiN layer, a SiCN layer, a TiN layer and/or a TaN layer). For example, each of the first adhesion layer 16 and the diffusion barrier layer 36 may include a conductive layer (e.g., a TiN layer and/or a TaN), and the second adhesion layer 26 may include an insulating layer (e.g., a SiN layer and/or a SiCN layer). In some embodiments, the diffusion barrier layer 36 may include a barrier layer (e.g., a TiN layer and/or a TaN) and a conductive liner (e.g., a Co layer), and the conductive liner may extend between the barrier layer of the diffusion barrier layer 36 and the upper metal wire 37. In some embodiments, the first and second adhesion layers 16 and 26 and the diffusion barrier layer 36 may be omitted. For example, the diffusion barrier layer 36 may have a thickness about two times a thickness of each of the first and second adhesion layers 16 and 26.

Each of the first, second and third insulating layers 14, 24 and 34 may include an insulating material (e.g., SiO, SiN, SiON or low-k material). The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric. The first and second adhesion layers 16 and 26 and the diffusion barrier layer 36 may include material(s) different from the first, second and third insulating layers 14, 24 and 34.

Figure 4:
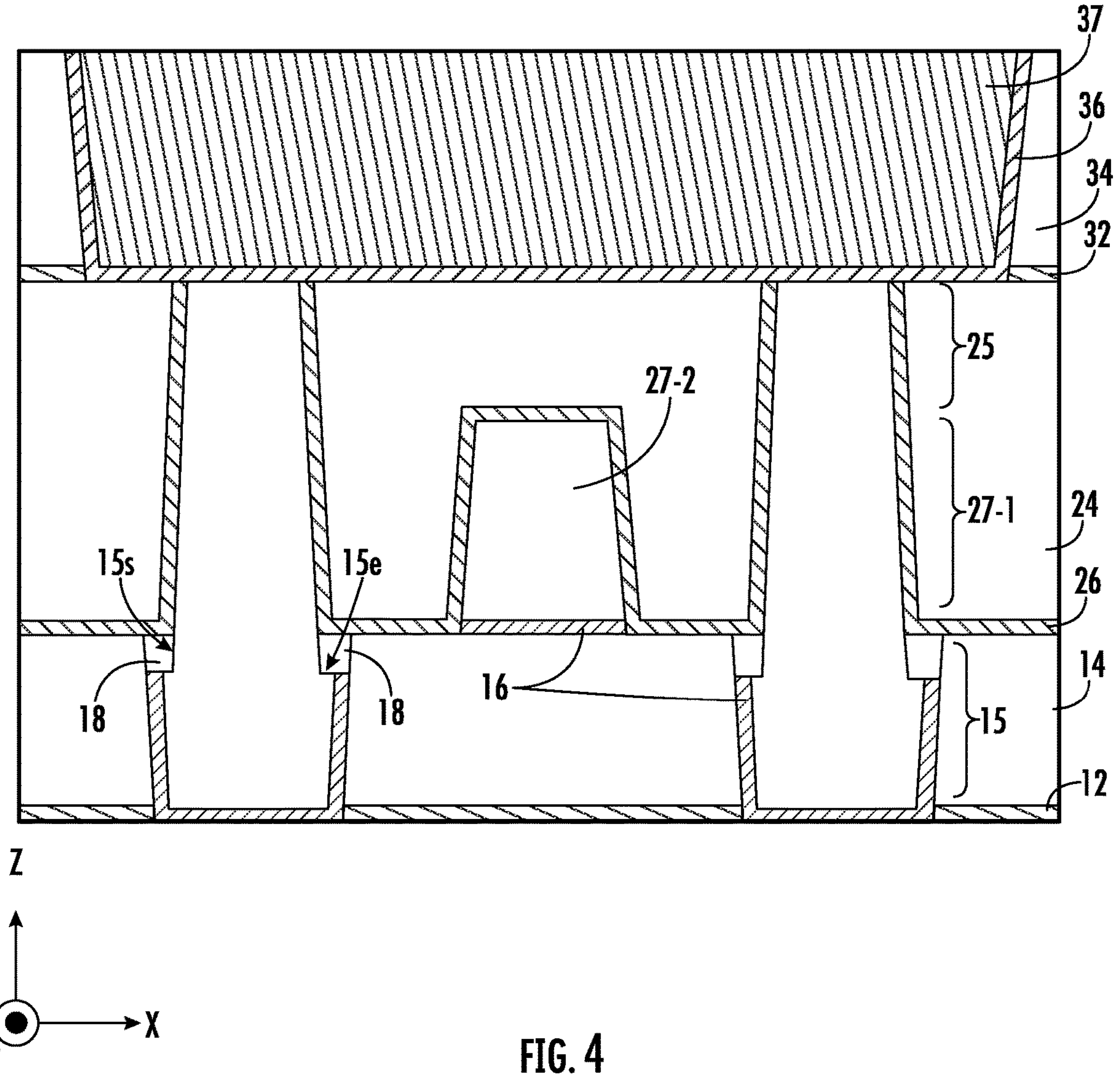
FIGS. 4, 5, 6 and 7 are each a cross-sectional view taken along the line A-A in FIG. 2 according to some embodiments.

FIG. 4 is a cross-sectional view taken along the line A-A in FIG. 2 according to some embodiments. The cross-sectional view in FIG. 4 is similar to the cross-sectional view in FIG. 3A with a primary difference being that a cavity 18 is provided in the first insulating layer 14.

An upper surface of the lower metal via 15 may include a middle portion contacting the first lower metal wire 27-1 and an edge portion 15*e* recessed toward a lower surface of the lower metal via 15. The middle portion of the upper surface of the lower metal via 15 may be coplanar with an uppermost surface of the first insulating layer 14. The middle portion and the edge portion 15*e* of the upper surface of the lower metal via 15 may be connected to each other by a side surface 15*s* of the lower metal via 15.

In some embodiments, the cavity 18 may be defined by the lower metal via 15 (i.e., the side surface 15*s* and the edge portion 15*e* of the upper surface of the lower metal via 15), the lower insulating layer 14 and the second adhesion layer 26, as illustrated in FIG. 4. A side surface of the first lower metal wire 27-1 and the side surface 15*s* of the lower metal via 15 may form a planar surface, as illustrated in FIG. 4. The cavity 18 may have a thickness, in the vertical direction Z, that is 10% to 30% of a thickness of the lower metal via 15 in the vertical direction Z. The cavity 18 may include air or gas (e.g., an inert gas) or may be a vacuum cavity.

Figure 5:
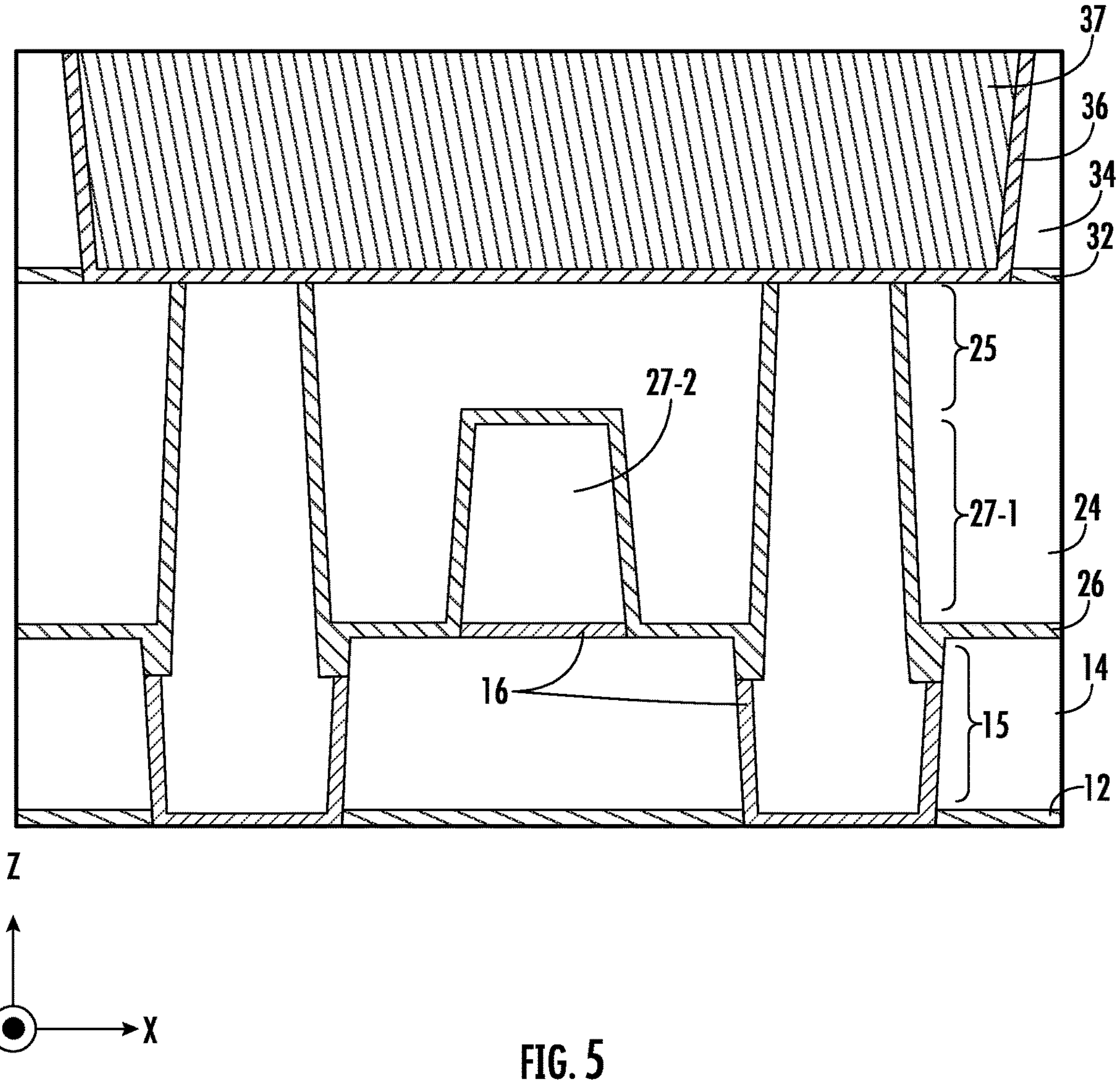

FIG. 5 is a cross-sectional view taken along the line A-A in FIG. 2 according to some embodiments. The cross-sectional view in FIG. 5 is similar to the cross-sectional view in FIG. 4 with a primary difference being that a portion of the second adhesion layer 26 may be formed in the cavity 18 in FIG. 4. The second adhesion layer 26 may fill the cavity 18 in FIG. 4 as illustrated in FIG. 5 or may fill a portion of the cavity 18 in FIG. 4.

The second adhesion layer 26 may separate the first insulating layer 14 from the side surface (the side surface 15*s* in FIG. 4) of the lower metal via 15, which connects the middle portion and the edge portion (the edge portion 15*e* in FIG. 4) of the upper surface of the lower metal via 15. In some embodiments, the second adhesion layer 26 may contact the side surface of the lower metal via 15 and the edge portion of the upper surface of the lower metal via 15.

Figure 6:
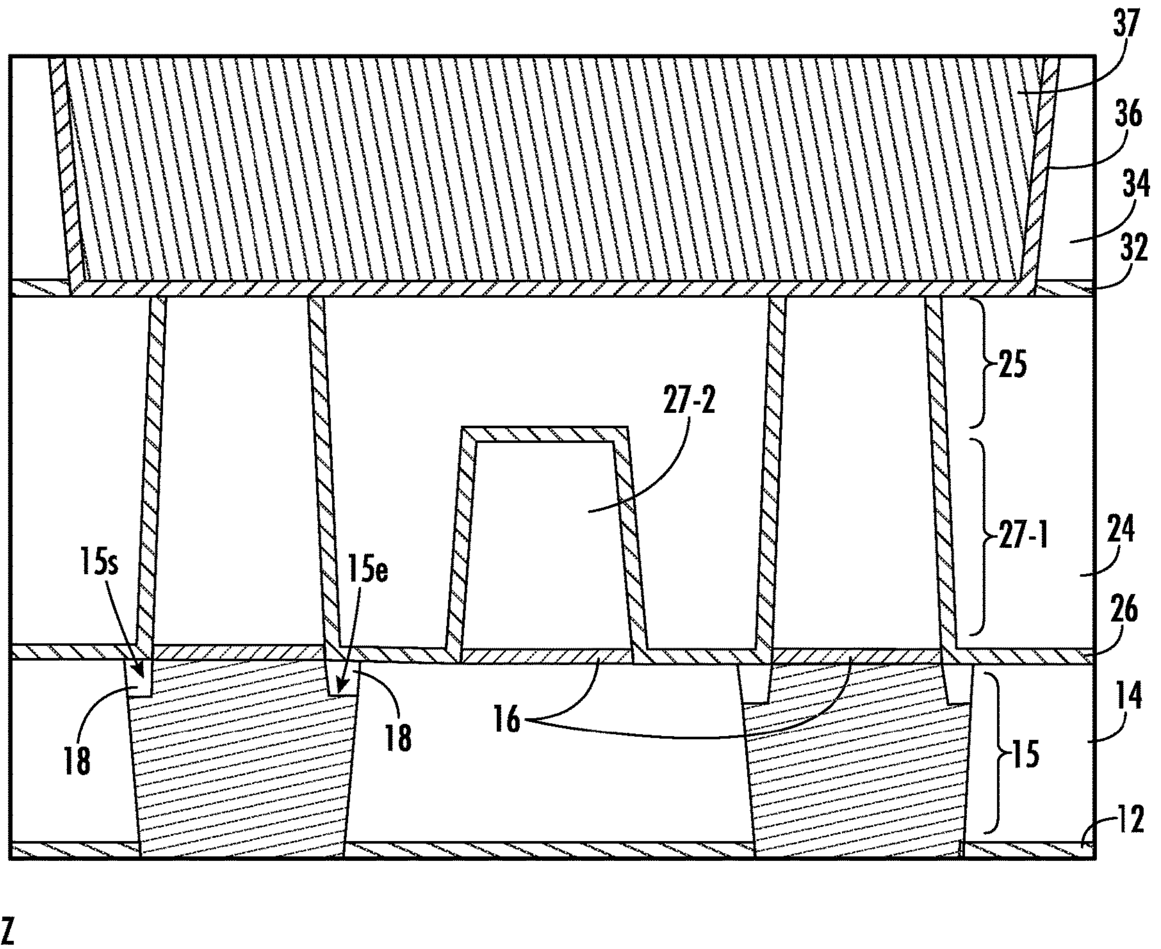

FIG. 6 is a cross-sectional view taken along the line A-A in FIG. 2 according to some embodiments. The cross-sectional view in FIG. 6 is similar to the cross-sectional view in FIG. 4 with primary differences being that the lower metal via 15 may include a metal element different from the first and second lower metal wires 27-1 and 27-2, and the first adhesion layer 16 may be provided between the lower metal via 15 and the first lower metal wire 27-1. The lower metal via 15 may include, for example, Cu, Al, W and/or Co.

Side surfaces of the first lower metal wire 27-1 and the first adhesion layer 16 may form a planar surface, and the second adhesion layer 26 may contact the side surfaces of the first lower metal wire 27-1 and the first adhesion layer 16. Further, the side surface 15*s* of the lower metal via 15, which defines the cavity 18, and a side surface of the first adhesion layer 16 may form a planar surface.

Figure 7:
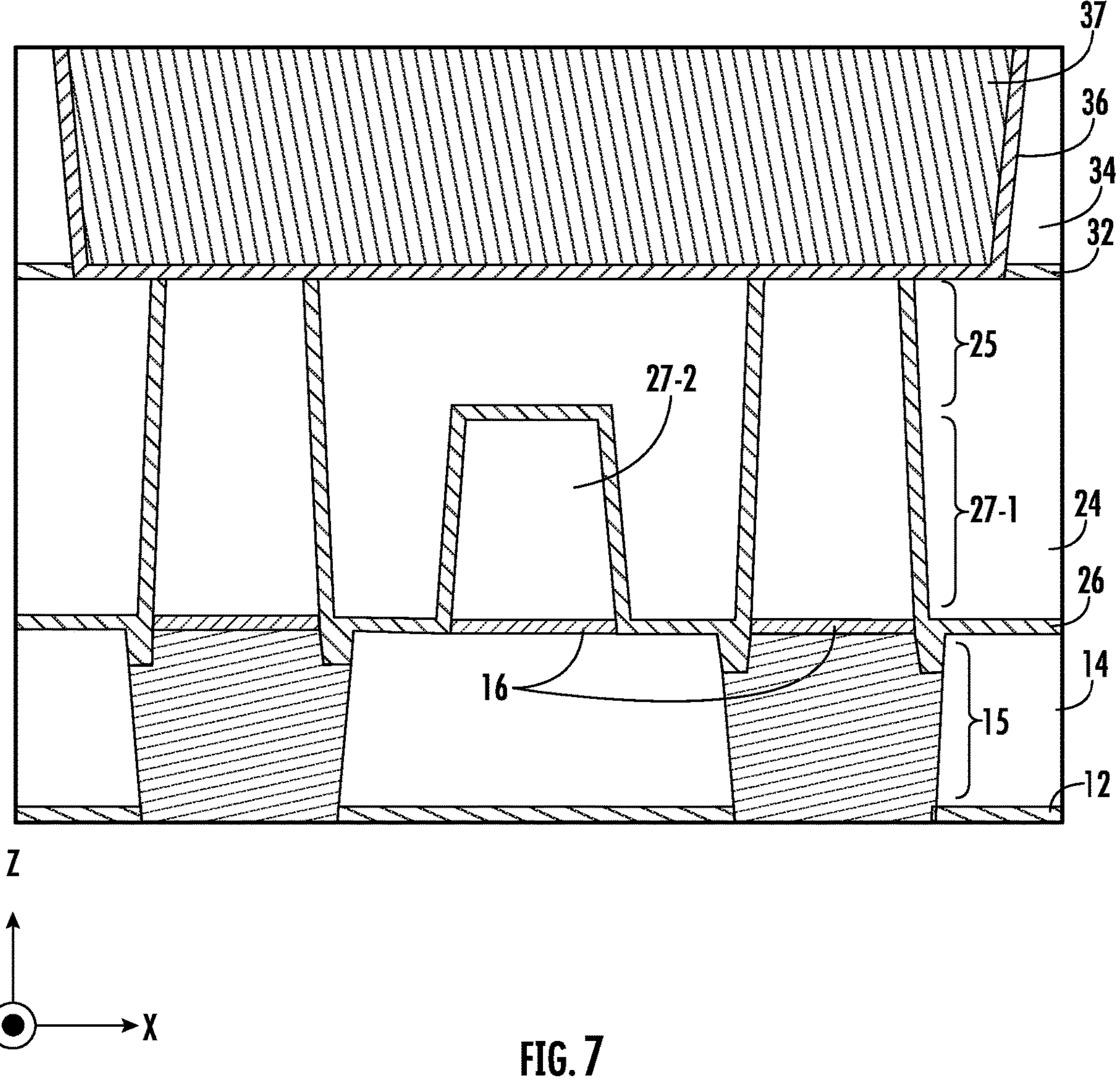

FIG. 7 is a cross-sectional view taken along the line A-A in FIG. 2 according to some embodiments. The cross-sectional view in FIG. 7 is similar to the cross-sectional view in FIG. 6 with a primary difference being that a portion of the second adhesion layer 26 may be formed in the cavity 18 in FIG. 6. The second adhesion layer 26 may fill the cavity 18 in FIG. 6 as illustrated in FIG. 7 or may fill a portion of the cavity 18 in FIG. 6.

Figure 8:
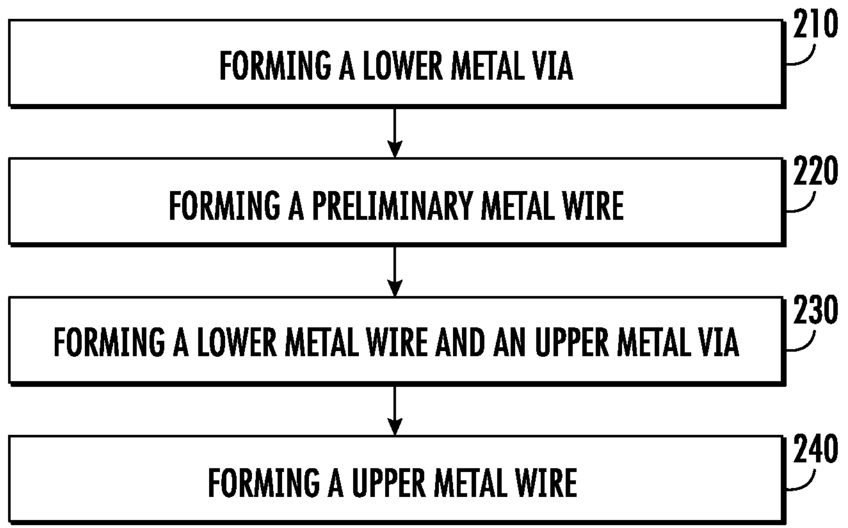
FIG. 8 is a flow chart of methods of forming an integrated circuit device according to some embodiments.
Figure 9:
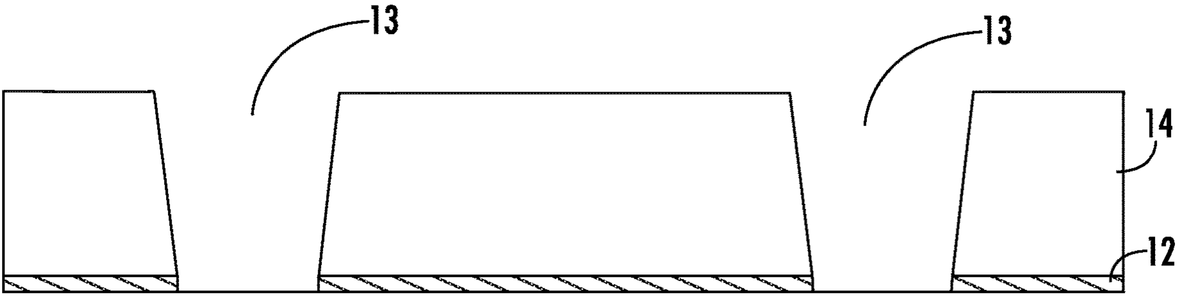
Figure 10:
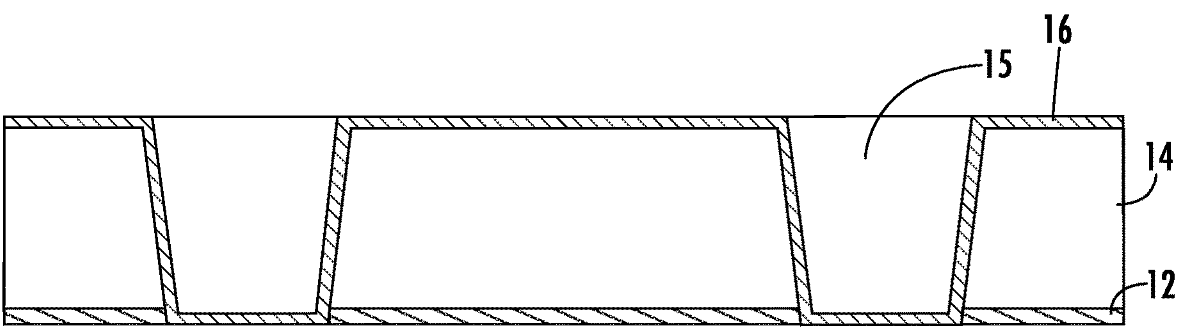
Figure 11:
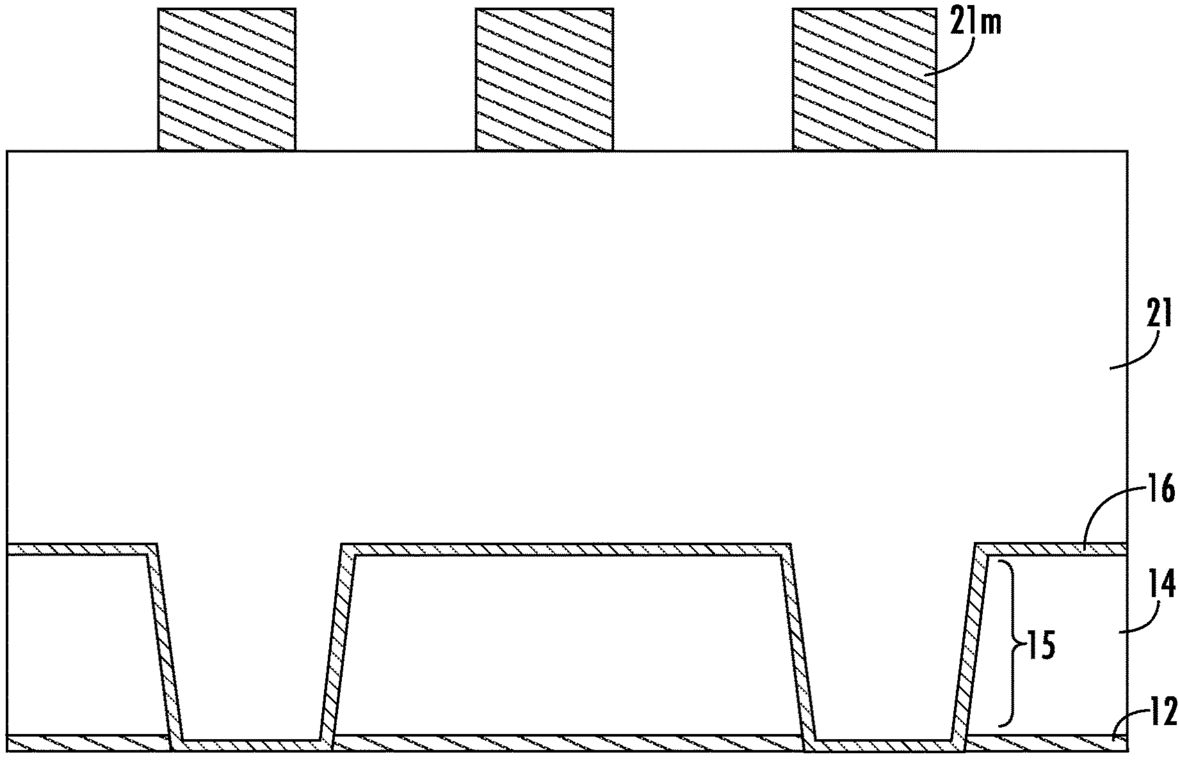

FIG. 8 is a flow chart of methods of forming an integrated circuit device (i.e., a BEOL structure) according to some embodiments, and FIGS. 9 to 15 are cross-sectional views illustrating methods of forming an integrated circuit device according to some embodiments. Specifically, FIGS. 9 to 11 are cross-sectional views taken along the line A-A of FIG. 2, and each of FIGS. 12 to 15 show cross-sectional views taken along the line A-A and the line B-B of FIG. 2.

Referring to FIGS. 8 to 10, the methods may include forming a lower metal via (Block 210). Referring to FIG. 9, a first etch stop layer 12 and a first insulating layer 14 may be formed, and then a first opening 13 may be formed in the first etch stop layer 12 and the first insulating layer 14.

Referring to FIG. 10, a first adhesion layer 16 may be formed on the first insulating layer 14 and in the first opening 13. The first adhesion layer 16 may have a uniform thickness along a surface of the first insulating layer 14. A lower metal via 15 may be formed in the first opening 13 on the first adhesion layer 16. As the lower metal via 15 is formed on the first adhesion layer 16, the first adhesion layer 16 may not be formed on an upper surface of the lower metal via 15, and the first adhesion layer 16 may expose the upper surface of the lower metal via 15. The lower metal via 15 may be a monolithic layer including Ru or Mo. For example, the lower metal via 15 may be a monolithic Ru layer.

Referring to FIG. 11, a metal layer 21 and a first mask pattern 21*m* may be formed on the lower metal via 15. The metal layer 21 may be a monolithic layer including Ru or Mo. For example, the metal layer 21 may be a monolithic Ru layer. The metal layer 21 may be directly formed on the exposed upper surface of the lower metal via 15 and thus may contact the exposed upper surface of the lower metal via 15. Accordingly, an adhesion layer may not be provided between the lower metal via 15 and the metal layer 21, and an interface between the lower metal via 15 and the metal layer 21 may be devoid of nitrogen. The first mask pattern 21*m* may include a photoresist and/or a hardmask material.

Referring to FIGS. 8 and 12, the metal layer 21 may be etched using the first mask pattern 21*m* as an etch mask, thereby forming first and second preliminary metal wires 23-1 and 23-2 (Block 220). The first preliminary metal wire 23-1 may contact the underlying lower metal via 15. Each of the first and second preliminary metal wires 23-1 and 23-2 may have a width in the first horizontal direction X decreasing with increasing distance from the lower metal via 15 in the vertical direction Z.

Referring to FIG. 13, the first mask pattern 21*m* may be removed and then a planarizing layer 23*p* may be formed on the first and second preliminary metal wires 23-1 and 23-2. The planarizing layer 23*p* may fill a space between the first and second preliminary metal wires 23-1 and 23-2. A second mask pattern 23*m* may be formed on the planarizing layer 23*p* and the first and second preliminary metal wires 23-1 and 23-2. The second mask pattern 23*m* may expose an upper surface of the second preliminary metal wire 23-2. The planarizing layer 23*p* may include an insulating material (e.g., a flowable insulating material such as a spin on glass insulator).

Referring to FIGS. 8 and 14, an upper portion of the first preliminary metal wire 23-1 may be etched using the second mask pattern 23*m* as an etch mask, thereby forming a first lower metal wire 27-1 and an upper metal via 25 (Block 230). An upper portion of the second preliminary metal wire 23-2 may also be etched while etching the first preliminary metal wire 23-1, thereby forming a second lower metal wire 27-2.

Referring to FIG. 15, the planarizing layer 23*p* and the second mask pattern 23*m* may be removed to expose the first and second lower metal wires 27-1 and 27-2 and the upper metal via 25 and then a second adhesion layer 26 and a second insulating layer 24 may be formed. The second adhesion layer 26 may have a uniform thickness on side surfaces of the lower metal wires 27-1 and 27-2 and a side surface of the upper metal via 25. A portion of the second adhesion layer 26 formed on an upper surface of the upper metal via 25 may be removed, and the second adhesion layer 26 may expose the upper surface of the upper metal via 25.

Referring again to FIGS. 3A and 8, an upper metal wire 37 may be formed on the upper metal via 25 (Block 240). For example, a second etch stop layer 32 and a third insulating layer 34 may be formed on the upper metal via 25 and then a second opening may be formed in the second etch stop layer 32 and the third insulating layer 34. A diffusion barrier layer 36 and the upper metal wire 37 may be formed in the second opening.

Figure 16:
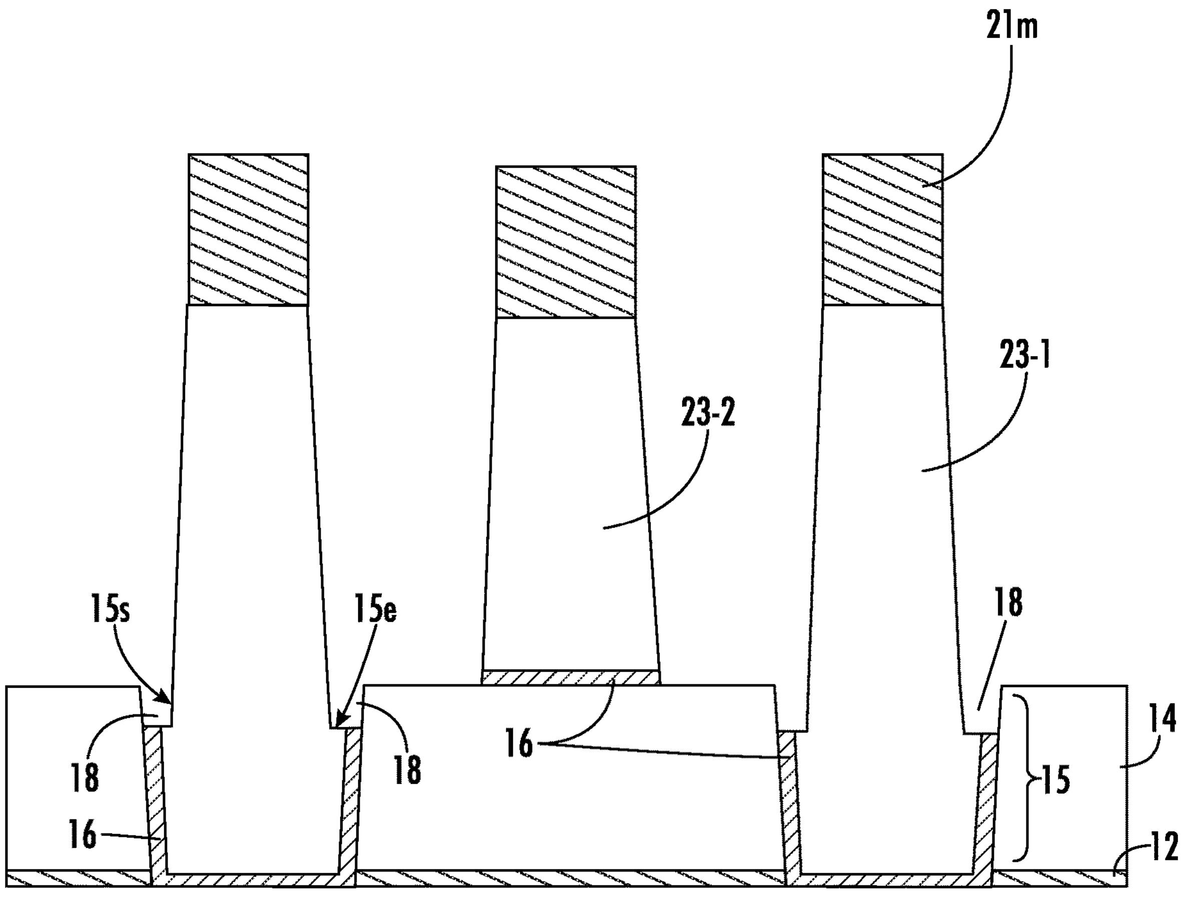
FIG. 16 is a cross-sectional view illustrating a method of forming an integrated circuit device according to some embodiments.

FIG. 16 is a cross-sectional view taken along the line A-A in FIG. 2 illustrating a method of forming the integrated circuit devices in FIGS. 4 and 5 according to some embodiments. Referring to FIG. 16, after processes described with reference to FIGS. 9 through 12 are performed, an additional etch process may be performed to etch an edge portion of the lower metal via 15 and a portion of the first adhesion layer 16 exposed by the first preliminary metal wire 23-1, thereby forming a cavity 18. In some embodiments, the additional etch process may be an over-etching step of the etching process for forming the first preliminary metal wire 23-1, which is further performed after the first preliminary metal wire 23-1 is completely formed. A thickness of the cavity 18 in the vertical direction Z may be from about 10% to about 30% of a thickness of the lower metal via 15 in the vertical direction Z. The first preliminary metal wire 23-1 may be used as an etch mask while etching the edge portion of the lower metal via 15, and thus a side surface of the first preliminary metal wire 23-1 and a side surface of the lower metal via 15 may form a planar surface. After the cavity 18 is formed, processes described with reference to FIGS. 13 through 15 may be performed.

Figure 17:
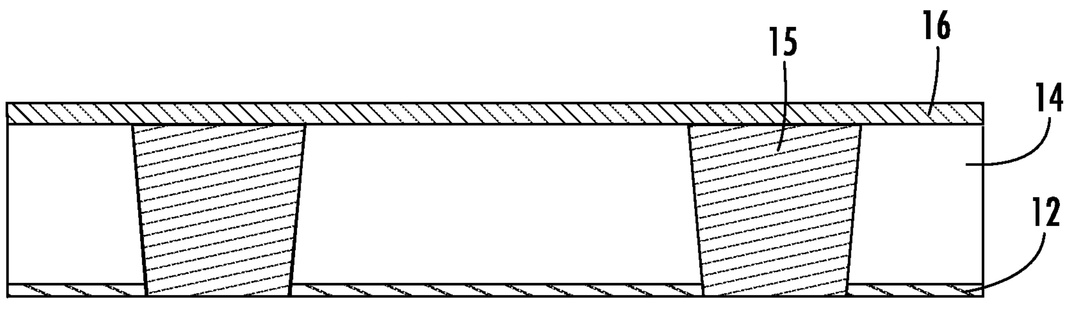
FIG. 17 is a cross-sectional view illustrating a method of forming an integrated circuit device according to some embodiments.

FIG. 17 is a cross-sectional view taken along the line A-A in FIG. 2 illustrating a method of forming the integrated circuit devices in FIGS. 6 and 7 according to some embodiments. Referring to FIG. 17, a lower metal via 15 may be formed in the first opening 13 after the structure in FIG. 9 is formed, and then a first adhesion layer 16 may be formed on lower metal via 15 and the first insulating layer 14. After the structure in FIG. 17 is formed, processes similar to those described with reference to FIGS. 11 to 15 may be performed.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:

a lower metal via within a first insulating layer;

an upper metal via in a second insulating layer on the first insulating layer;

a lower metal wire in the second insulating layer; and an upper metal wire on the upper metal via, wherein the upper metal via is between the lower metal wire and the upper metal wire, wherein the upper metal via and the lower metal wire are connected to each other as a monolithic structure without an interface therebetween, wherein a width of an upper end of the lower metal wire is greater than a width of an upper surface of the upper metal via, wherein a side surface of the lower metal wire is aligned with a side surface of the upper metal via, wherein the lower metal via comprises ruthenium (Ru) or molybdenum (Mo), wherein the lower metal wire comprises Ru or Mo, and wherein the upper metal via comprises Ru or Mo.

2. The integrated circuit device of claim 1, wherein the lower metal via is a monolithic layer.

3. The integrated circuit device of claim 1, wherein an interface between the lower metal via and the lower metal wire is devoid of nitrogen.

4. The integrated circuit device of claim 1, wherein each of the lower metal via, the lower metal wire and the upper metal via consists of Ru or Mo.

5. The integrated circuit device of claim 1, wherein the lower metal wire is a lower portion of the monolithic structure, and the upper metal via is an upper portion of the monolithic structure.

6. The integrated circuit device of claim 5, wherein a width of the monolithic structure decreases with increasing distance from the lower metal via.

7. The integrated circuit device of claim 1, wherein an edge portion of an upper surface of the lower metal via comprises a recess.

8. The integrated circuit device of claim 7, further comprising an insulating adhesion layer that is in the recess.

9. An integrated circuit device comprising:

a first metal via in a first insulating layer;

a metal wire in the first insulating layer; and a second metal via within a second insulating layer, wherein the metal wire is between the first metal via and the second metal via, wherein a middle portion of an upper surface of the second metal via contacts the metal wire, and an edge portion of the upper surface of the second metal via is recessed toward a lower surface of the second metal via, creating a recess therein, wherein the first metal via and the metal wire are connected to each other without an interface therebetween, and wherein a width of an upper surface of the metal wire is greater than a width of an upper surface of the first metal via.

10. The integrated circuit device of claim 9, wherein a side surface of the metal wire and a side surface of the recess form a planar surface.

11. The integrated circuit device of claim 9, further comprising an insulating adhesion layer contacting a side surface of the metal wire and a side surface of the recess.

12. The integrated circuit device of claim 11, wherein the insulating adhesion layer comprises silicon and nitrogen.

13. The integrated circuit device of claim 9, wherein a cavity is surrounded by the edge portion of the upper surface of the second metal via, the second insulating layer, and the first insulating layer.

14. The integrated circuit device of claim 9, wherein each of the first metal via, the metal wire, and the second metal via comprises ruthenium (Ru) or molybdenum (Mo).

15. The integrated circuit device of claim 9, further comprising a conductive adhesion layer between the metal wire and the second metal via.

* * * * *